United States Patent [19]

Kitamura

[11] Patent Number: 5,566,108

[45] Date of Patent: Oct. 15, 1996

[54] SYNCHRONIZED SEMICONDUCTOR MEMORY

[75] Inventor: Mamoru Kitamura, Tokyo, Japan

[73] Assignee: NEC Corporation, Japan

[21] Appl. No.: 537,478

[22] Filed: Oct. 2, 1995

[30] Foreign Application Priority Data

Sep. 30, 1994 [JP] Japan .................................. 6-236527

[51] Int. Cl.$^6$ ...................................................... G11C 8/00
[52] U.S. Cl. ...................... 365/233; 365/230.03; 365/194
[58] Field of Search .............................. 365/233, 230.03, 365/194, 189.08, 149

[56] References Cited

U.S. PATENT DOCUMENTS 5,384,750  1/1995  Lee ............................ 365/233
5,386,391  1/1995  Watanabe ..................... 365/233

*Primary Examiner*—David C. Nelms
*Assistant Examiner*—Huan Hoang

[57] ABSTRACT

A synchronized semiconductor memory device comprises a memory cell array, an address input circuit, an address set circuit, a command input circuit, a data reading/writing control circuit, a data output circuit, a data input circuit, a clock input circuit, an internal clock generating circuit, and an internal clock timing control circuit. The internal clock timing control circuit includes a delay circuit to receive a reference internal clock generated in the internal clock generating circuit, a plurality of level signals set in accordance with a given mode register set cycle, and a plurality of row address enable signals, and for generating at least an internal clock signal for timing-controlling the data reading/writing circuit. The internal clock timing control circuit also includes a logic circuit to receive the reference internal clock generated in the internal clock generating circuit and the plurality of row address enable signals, and for generating another internal clock signal for timing-controlling the data input circuit.

3 Claims, 7 Drawing Sheets

SYNCHRONIZED SEMICONDUCTOR MEMORY

BACKGROUND OF THE INVENTION

1. Field of the Invention

The present invention relates to a synchronized semiconductor memory.

2. Description of Related Art

Synchronized semiconductor memory devices using dynamic random access memories (DRAM) have been variously designed to operate with a high speed, but in the prior art DRAM, there is a problem that an access time of the DRAM interferes with elevation of the system capacity in a high speed system such as a RISC (reduced instruction set computer) type MPU (microprocessor unit) whose system clock frequency exceeds 100 MHz (10 ns). In order to solve this problem, a semiconductor memory device synchronized with an external clock has been proposed. There are many techniques to realize this synchronized semiconductor memory device. One of these techniques is so called three-stage pipeline. This is a technique which realizes a high speed operation by dividing a reading/writing operation starting a column address receiving, with two latch circuits, into three parts which operate in parallel to one another.

A prior art synchronized semiconductor memory device will now be explained with reference to FIGS. 1 to 4. FIG. 1 is a block diagram illustrating a construction of the prior art synchronized semiconductor memory device, and FIGS. 3 and 4 are timing charts illustrating an operation of the prior art synchronized semiconductor memory device. FIG. 2 is a logic circuit diagram showing a construction of the delay circuit included in the prior art synchronized semiconductor memory device.

In the following explanation, the negation of a chip selection signal CS, a row address strobe signal RAS, a column address strobe signal CAS and a write enable signal WE are indicated as CSB, RASB, CASB and WEB, respectively.

Referring to FIG. 1 and FIG. 3, at a time to an ACTIVE command (in a row address operation command, both of the signals CSB and RASB are at a LOW level, and both of the signals CASB and WE are at a HIGH level) is inputted into input terminals 61. The command is decoded by an input circuit 21, and then latched in circuit (D flip-flop circuit) 22. Furthermore, at the time t0, a clock is inputted from a terminal 62 through an input circuit 34 to an internal clock generating circuit 35.

In the internal clock generating circuit 35, an internal clock signal (1) 36 is generated, and supplied to latch circuits 2, 22 and 31, logic circuits 37 and 43, a writing control circuit 26, a read control circuit 27, and a delay circuit 39. The logic circuit 37 receives the internal clock signal (1) 36 and generates an internal clock signal (2) 38. Furthermore, the delay circuit 39 receives the internal clock signal (1) 36 and other input signals, and generates an internal clock signal (5) 40, an internal clock signal (6) 41, and an internal clock signal (7) 42. Similarly, the logic circuit 43 receives the internal clock signal (1) 36, the internal clock signal (7) 42 supplied from the delay circuit 39, an internal clock signal (3) enable signal 30 outputted from the reading control circuit 27, and generates an internal clock signal (3) 44.

The ACTIVE command as mentioned above is latched in the latch circuit in response to the internal clock signal (1) 36, and the latched active command is supplied to a row address control circuit 13, which in turn generates an "A bank" row address enable signal ARAE 14 and, a "B bank" row address enable signal BRAE 15. Furthermore, a row address ADD(X) inputted into terminals 59 is supplied through an input circuit 1to the latch circuit (D flip-flop circuit) 2, and then latched in the latch circuit 2 in response to the internal clock signal (1) 36. Thereafter, the latched row address ADD(X) is inputted through a row address buffer 7into a row decoder 8, which in turn selects a row selection line 9corresponding to the row address ADD(X).

The synchronized semiconductor memory device shown FIG. 1 is an example of a two-bank constitution. Here, the bank is that a selection and a precharge of a row address can be independently executed in each bank, and the synchronized semiconductor memory containing the two banks has two sets of row address control circuits. As mentioned above, ARAE shown in FIG. 3 is a row address enable signal for the A bank, and BRAE is a row address enable signal for the B bank. When the ACTIVE command signal is inputted, the signals ARAE and BRAE are brought to a HIGH level. The time chart shown in FIG. 3 shows an example in which the A bank is selected and therefore the signal ARAE is at the HIGH level.

Now, a data reading operation will be explained. Referring to FIGS. 1 and 4, at the time $t_0$, the READ command (the reading operation command: both of the signals CSB and CASB are at a LOW level, both of the signals RASB and WEB are at a HIGH level) is inputted, and the address ADD(A1) is inputted to the terminals 59. Therefore, the READ command is decoded in the input circuit 21 and supplied into the latch circuit 22. The READ command is latched in the latch circuit 22 in response to the internal clock signal (1) 36, and the latched READ command signal 25 is inputted into a column address control circuit 11, and also sent to a read control circuit 27.

The column address control circuit 11 receives the latched READ command signal 25, and generates the column address enable signal 12 to a row address buffer 3. And then, the address ADD(1) is inputted into the latch circuit 2 through the input circuit 1, and latched in response to the internal clock signal (1) 36. The latched address ADDA(1) is inputted into a column decoder 4 through a column address buffer 3. The address ADD(A1) outputted from the column decoder 4 is latched in a latch circuit (D type latch) 5 in response to the internal clock signal (2) 38outputted from the logic circuit 37, so that a column selection line 6corresponding to the given address is selected. Thus, memory cells to be read are selected.

Next, the output data read from a memory cell array 10 through sense amplifier 16 is supplied through a R/W (READ/WRITE) bus 17 and amplified by a data amplifier 18, and then, latched in a latch circuit (D type flip-flop circuit) 19 in response to the internal clock signal (3) 44corresponding to the clock at a time $t_2$, and outputted to a terminal 60through an output circuit 20. FIG. 4 shows a time chart in the case of a burst length (bit length to be read and written at the same time) of 4 bits. In FIG. 4, in a series of operations, the operation for the following bits is executed each in one cycle, and these operations are processed in parallel to one another. Namely, the second bit (A2) is executed with three clocks of $t_1$~$t_3$, the third bit (A3) is executed with three clocks of $t_2$~$t_4$, and the forth bit (A4) is executed with three clocks of $t_3$~$t_5$.

Next, a data writing operation will be explained. This operation is almost the same with the reading operation as mentioned above. Referring to FIG. 4, at a time $t_8$, a WRITE command (writing operation command: the signals CSB, CASB and WEB are at a LOW level, and the signal RASB is at a HIGH level) is inputted from the terminal 61, and a writing data (DQ) is inputted from the terminal 60. In addition, an address ADD(B1) is inputted from the terminal 59.

The WRITE command is decoded by the input circuit 21, and supplied to the latch circuit 22. In the latch circuit 22, the WRITE command is latched in response to the internal clock signal (1) 36 outputted from the internal clock signal generation circuit 35 corresponding to the clock of the time $t_8$, and a WRITE command signal 24 is outputted from the latch circuit 22, and sent to a writing control circuit 26. The writing data (DQ) inputted from the terminal 51 is sent into a latch circuit (D type flip-flop) 31 through an input circuit 32, and then, is latched in response to the internal clock signal (1) 36 outputted from the internal clock signal generation circuit 35 corresponding to the clock of the time $t_8$, so that the latched data is sent into the writing control circuit 26.

On the other hand, an address ADD (B1) is inputted into the latch circuit 2 through the input circuit 1, and latched in the latch circuit 2 in response to the internal clock signal (1) 36 outputted from the internal clock signal generation circuit 35 corresponding to the clock of the time $t_8$. The latched address ADD(B1) is inputted into the column decoder 4 through the column address buffer 3. An address ADD (B1) outputted from the column decoder 4 is latched in the latch circuit 5 in response to the internal clock signal (2) 38 outputted from the logic circuit 37 corresponding to the clock of the time $t_9$, so that a column selection line 6 corresponding to the given address ADD(B1) is selected. Thus, a memory cell to be written in the memory cell array 10 is selected.

At the same time, in response to the internal clock signal (1) 36 corresponding to the time $t_9$, the write data (DQ) is outputted from the write control circuit 26 and is sent to the sense amplifier 16 through the R/W (READ/WRITE) bus 17, so that it is amplified by the sense amplifier 16, and is written onto the corresponding memory cell of memory cell array 10. And, the column selection number 9 is brought to a non-selected state in response to the internal clock signal (2) 38 corresponding to the clock of the time $t_{10}$, so that the writing operation finishes. Similarly to the reading operation, the writing operation is executed with a unit of 4 bits in parallel. Namely, the second bit (B2) is executed with three clocks of $t_9$~$t_{11}$, the third bit (B3) is executed wit three clocks of $t_{10}$~$t_{12}$, and the forth bit (B4) is executed with three clocks of $t_{11}$~$t_{13}$.

The above mentioned operation mode is called "CAS LATENCY 3", because, in the reading operation, data is outputted by a third clock counted after an input of the READ command is inputted. This is set by a mode set circuit 33 when a mode register set cycle (a cycle for setting CAS LATENCY or burst length, etc.: the signals CSB, RASB CASB and WEB are at a LOW level). The operation mode includes "CAS LATENCY 2" and "CAS LATENCY 1" in addition to "CAS LATENCY 3".

In the case of the "CAS LATENCY 2" mode, the internal clock signal (2) 38 is fixed to a HIGH level in order to output the data at the timing of the second clock. Namely, the latch (D type latch circuit) 5 is controlled to allow a signal to always pass therethrough, so the effective number of latches is only two. As the result, the first stage and the second stage of the pipeline operate with the first clock, and the third stage operates with the second clock.

In the case of the "CAS LATENCY 1" mode, if the latch circuit 19 is of a D type latch circuit, both of the internal clock signal (3) 38 and the internal clock signal (3) 44 may be fixed to the HIGH level, but, if the latch circuit 19 is of a D type flipflop circuit, all of the first stage, the second stage and the third stage of the pipeline can be controlled to operate continuously with only one clock, by fixing the internal clock signal (2) 38 to the HIGH level and by generating the internal clock signal (3) 44 from the internal clock signal (7) 42 by using a delay circuit 39. In cases of the "CAS LATENCY 2" and "CAS LATENCY 1", the signals from the writing control circuit 26 and the read control circuit 27 are outputted at timings different from the output timing of those signals in the operating mode "CAS LATENCY 3", and therefore, are generated by using the internal clock signal (5) 40 and the internal clock signal (6) 41 outputted from the delay circuit 39, instead of the internal clock signal (1) 36.

In conclusion, the minimum possible cycle of each operating mode in a case of a device having an address access bus of 30 ns is following.

"CAS LATENCY 3" is a cycle time of 10 ns.
"CAS LATENCY 2" is a cycle time of 15 ns.
"CAS LATENCY 1" is a cycle time of 30 ns.

Now, referring to FIG. 2 which is a logic diagram of the delay circuit 39 shown in FIG. 1, generation of the internal clock signal (5) 40, the internal clock signal (6) 41 and the internal clock signal (7) 42 will be described. As shown in FIG. 2, the delay circuit 39 includes two inverters 49 and 50, three AND circuits 51, 52 and 53, and three delays 54, 55 and 56, which are connected as shown. In addition, level signals CLT1, CLT2 and CLT3 are set by the mode setting circuit 33 shown in FIG. 1 in the above mentioned mode register cycle (for setting the "CAS LATENCY", the burst length, etc.), in order to designate the "CAS LATENCY" mode. The signal CLT1 is at a HIGH level in the "CAS LATENCY 1" mode, and the signal CLT2 is at a HIGH level in the "CAS LATENCY 2" mode. Furthermore, the signal CLT3 is at a HIGH level in the "CAS LATENCY 3" mode. The internal clock signal (5) 40 and the internal clock signal (6) 41 are required in the "CAS LATENCY 1" mode and the "CAS LATENCY 2" mode, but are fixed to a LOW level in the "CAS LATENCY 3" mode. Thus, the timing of generation of the internal clock signal (5) 40 and the internal clock signal (6) 41 is controlled in accordance with a logical level of the level signals CLT1 and CTL2. The internal clock signal (7) 42 is generated on the basis of the internal clock signal (1) 36 in the "CAS LATENCY 1" mode In the prior art synchronized semiconductor memory device as mentioned above, in response to application of an external clock signal, the internal clock generating circuit is put and maintained always in an operating condition, so that, in a standby condition waiting for application of a command from an external, an electric current is supplied to not only the internal clock generating circuit but also related circuits other than the internal clock generating circuit. Namely, these circuits are always in an operating condition. Therefore, the standby current is relatively large, and the power supply current are wastefully consumed.

SUMMARY OF THE INVENTION

Accordingly, it is an object of the present invention to provide a synchronized semiconductor memory device which has overcome the above mentioned defect of the conventional one.

Another object of the present invention is to provide a synchronized semiconductor memory device having a reduced power supply current consumption in the standby mode.

The above and other objects of the present invention are achieved in accordance with the present invention by a synchronized semiconductor memory device comprising:

a memory cell array constituting the dynamic random access memory;

address input means receiving an external address signal containing a row address/column address;

address set means receiving an address information from the address input means and for generating and outputting a memory selecting signal to the memory cell array;

command input means receiving an external command signal containing a row address selection control/reading control/writing control;

data reading/writing control means receiving a command information from the command input means, and for controlling a data read operation and a data writing operation to the memory cell array;

data output means controlled by the data reading/writing control means and for outputting the data read from the memory cell array;

data input means controlled by the data reading/writing control means and for receiving the data to written into the memory cell array;

clock input means receiving an external clock signal; and internal clock generation means receiving a clock information from the clock input means, and for generating a predetermined reference internal clock; and internal clock timing control means receiving the predetermined reference internal clock, and for generating a plurality of internal clock signals having different timings for the address input means, the address set means, the command input means, the data reading/writing means, the data output means and the data input means;

wherein the improvement comprises:

first circuit means, provided in the internal clock timing control means, to receive the reference internal clock generated in the internal clock generation means, a plurality of level signals set in accordance with a given mode register set cycle, and a plurality of row address enable signals, and for generating at least an internal clock signal for timing-controlling the data reading/writing means; and second circuit means, provided in the internal clock timing control means, to receive the reference internal clock generated in the internal clock generation means and the plurality of row address enable signals, and for generating another internal clock signal for timing-controlling the data input means.

In a preferred embodiment, the first circuit means includes an OR circuit receiving an "A bank" row address enable signal and a "B bank" row address enable signal, a first AND circuit receiving an output of the OR circuit and the reference internal clock, first and second inverters receiving a level signal for the "CAS LATENCY 3", a second AND circuit receiving an output of the first AND circuit and an output of the first inverter, a third AND circuit receiving the output of the first AND circuit and an output of the second inverter, a fourth AND circuit receiving the output of the first AND circuit and a level signal for the "CAS LATENCY 1", a first delay circuit receiving the level signal for the "CAS LATENCY 1", an output of the second AND circuit and a level signal for the "CAS LATENCY 2", for delaying the received signal so as to output the delayed received signal as a first internal clock, a second delay circuit receiving the level signal for the "CAS LATENCY 2", an output of the third AND circuit and the level signal for the "CAS LATENCY 1", for delaying the received signal so as to output the delayed received signal as a second internal clock, and a third delay circuit receiving an output of the fourth AND circuit, for delaying the received signal so as to output the delayed received signal as a third internal clock. In addition, the second circuit means includes an OR circuit receiving the "A bank" row address enable signal and the "B bank" row address enable signal, and an AND circuit receiving an output of the OR circuit and the reference internal clock, for outputting a logical product signal as the above mentioned another internal clock signal.

The above and other objects, features, and advantages of the present invention will be apparent from the following description of preferred embodiments of the invention with reference to the accompanying drawings.

DESCRIPTION OF THE PREFERRED EMBODIMENTS

Figure 5:
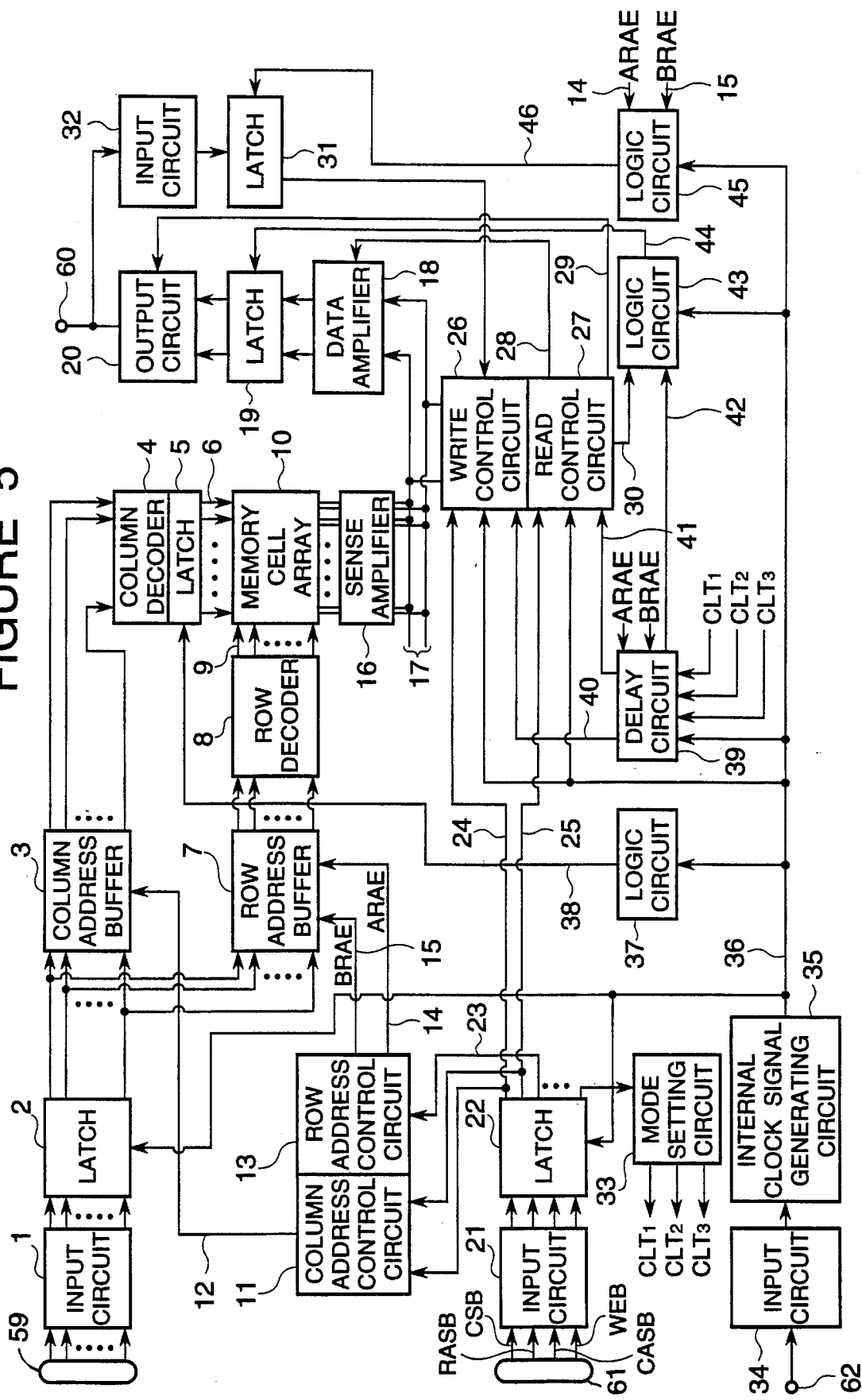
FIG. 5 is a block diagram illustrating a construction of one embodiment of the synchronized semiconductor memory device in accordance with the present invention.

Referring to FIG. 5, there is shown a block diagram illustrating a construction of one embodiment of the synchronized semiconductor memory device in accordance with the present invention. In FIG. 5, elements similar to those shown in FIG. 1 are given the same Reference Numerals, and a detailed explanation thereof will be omitted.

The shown embodiment includes an input circuit 1 for receiving an address ADD, an input circuit 21 for receiving a plurality of command signals for controlling a row address selection/reading/writing, an input circuit 34 for receiving an external clock, an output circuit 20 for outputting data, an input circuit 32 for receiving data, latch circuits 2, 5, 19, 22 and 31, a column address buffer 3, a column decoder 4, a row address buffer 7, a row decoder 8, a memory cell array 10, a column address control circuit 11, a row address control 13, a sense amplifier 16, a data amplifier 18, a writing control circuit 26, a reading control circuit 27, a mode setting circuit 33, an internal clock signal generation circuit 35, logic circuits 37, 43 and 48 and a delay circuit 39.

Figure 1:
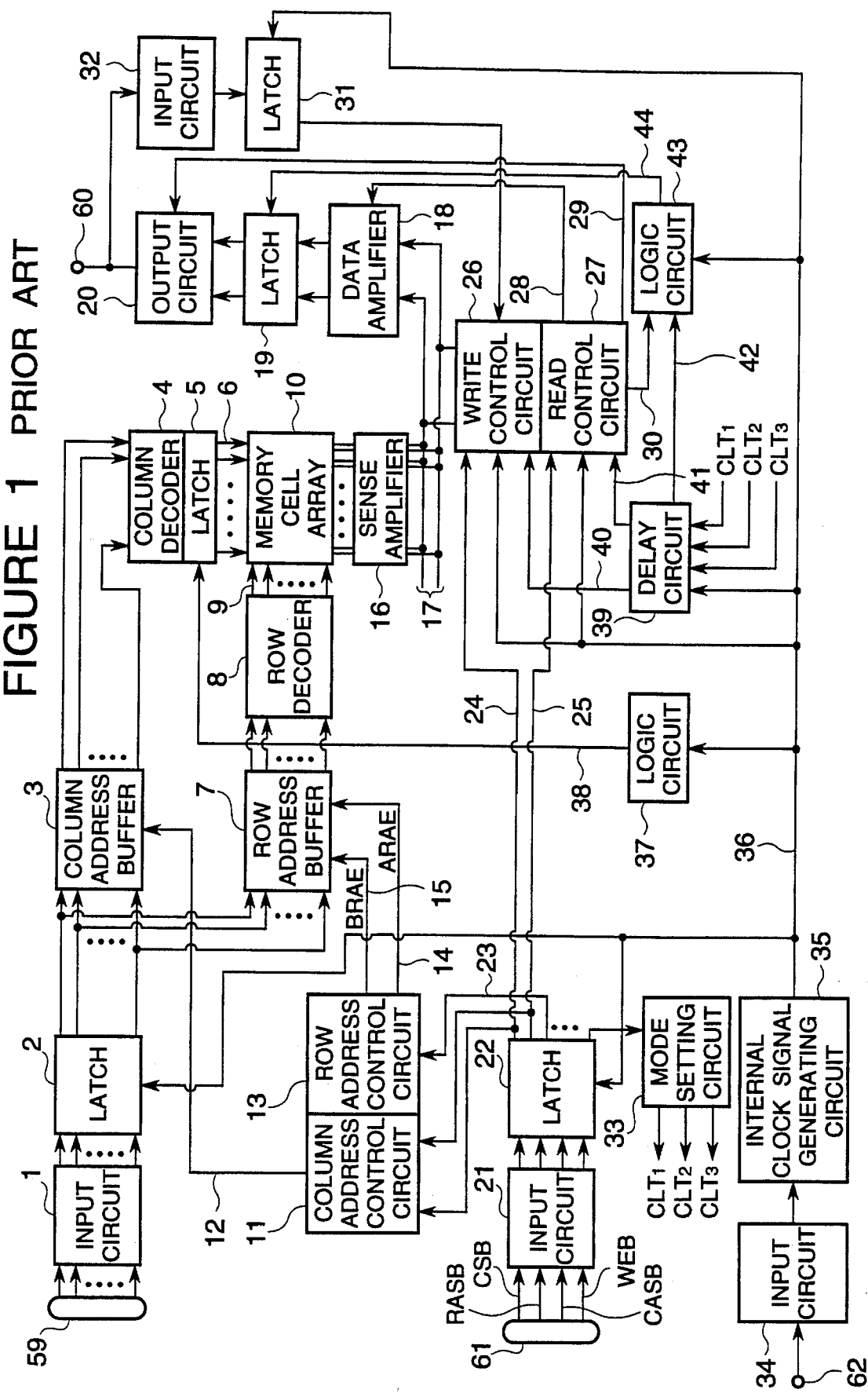
FIG. 1 is a block diagram illustrating a construction of the prior art synchronized semiconductor memory device.
Figure 2:
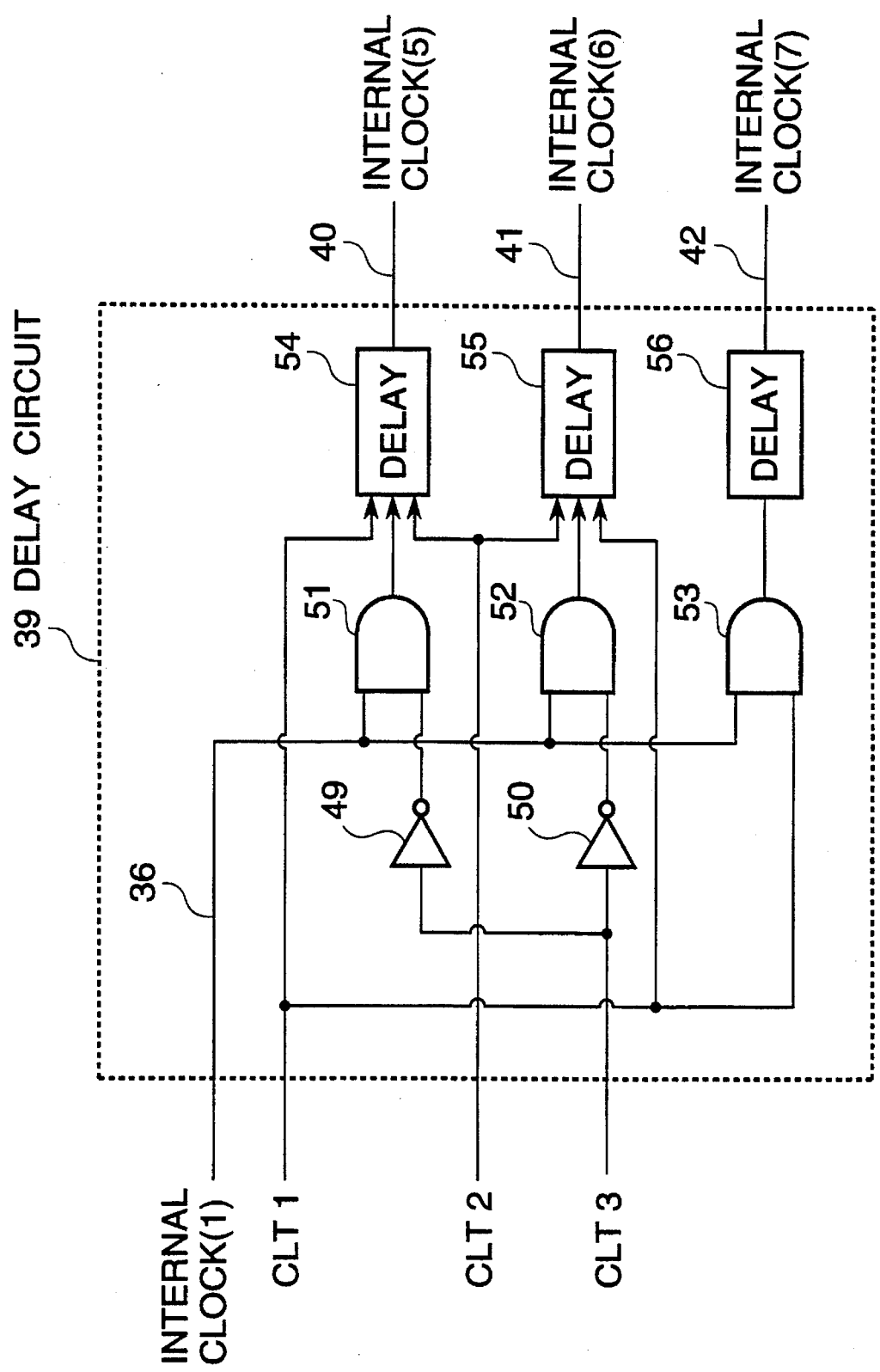
FIG. 2 is a logic circuit diagram showing a construction of the delay circuit included in the prior art synchronized semiconductor memory device shown in FIG. 1.
Figure 3:
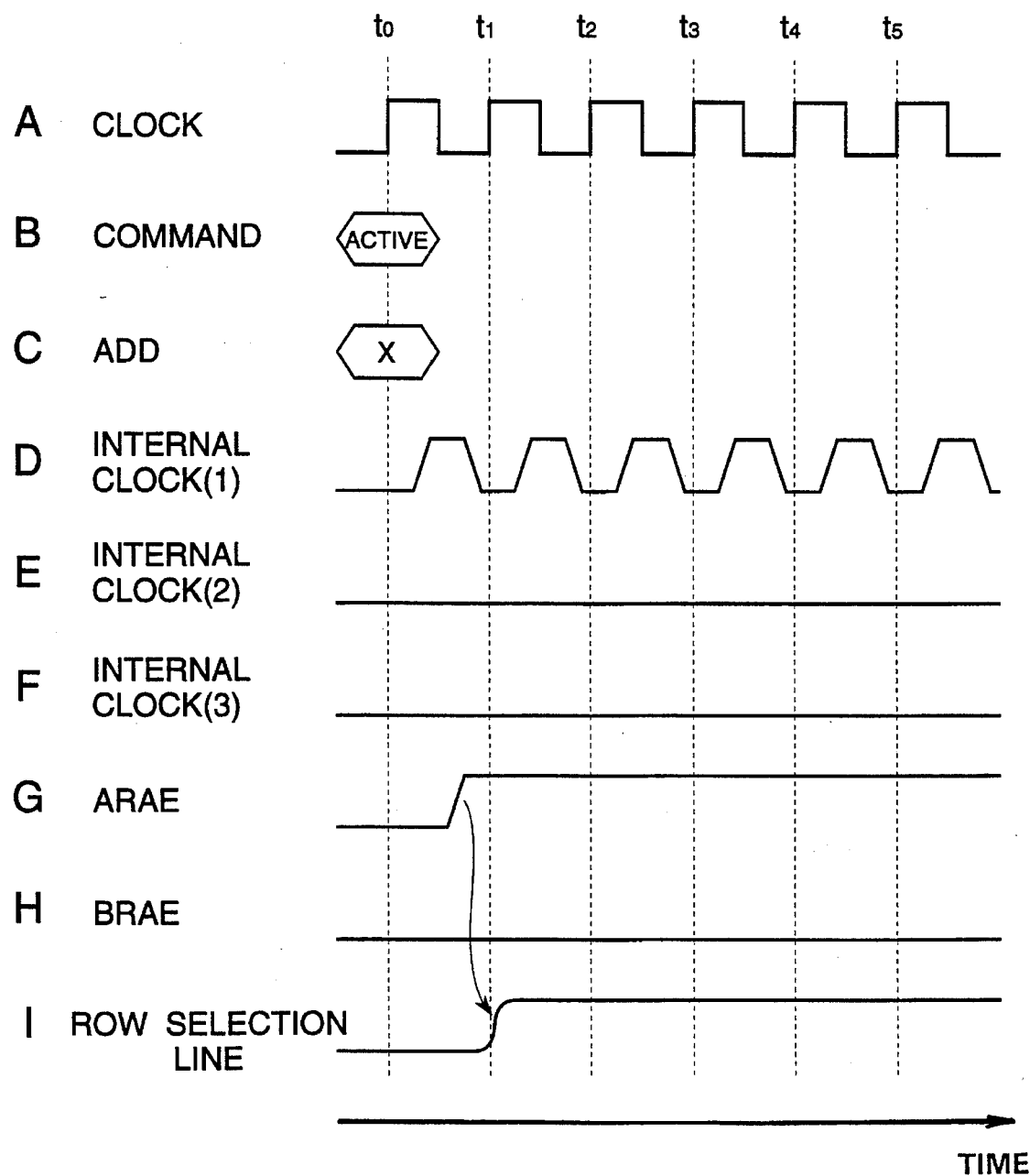
FIGS. 3 and 4 are timing charts illustrating an operation of the prior art synchronized semiconductor memory device shown in FIG. 1.
Figure 4:
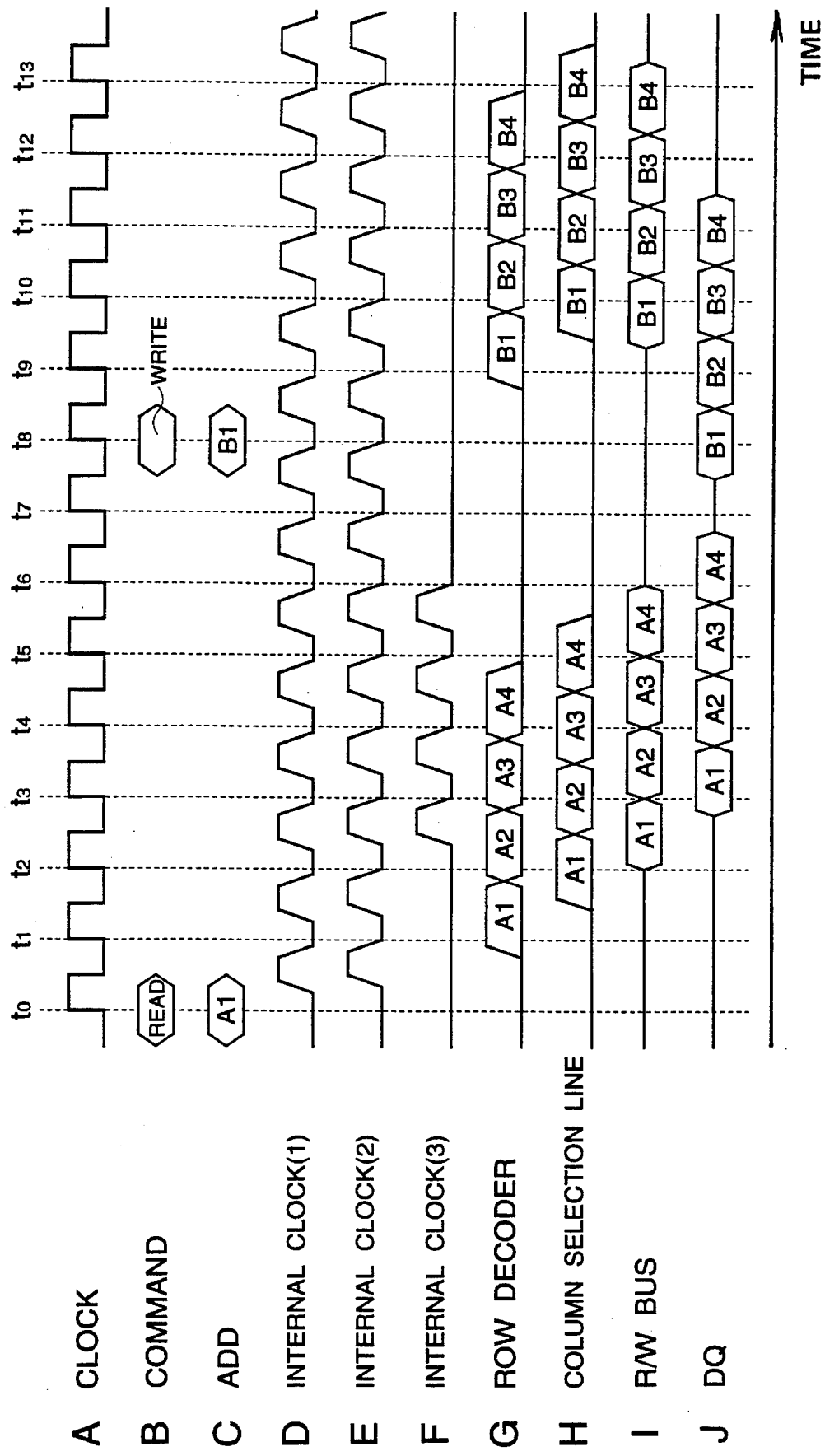

As seen from comparison between FIGS. 1 and 5, the shown embodiment is different from the prior art example shown in FIG. 1, in that the shown embodiment includes the delay circuit 39 having different construction and function, in place of the delay circuit 39 shown in FIGS. 1 and 2, and the shown embodiment also includes the logic circuit 45 newly added.

Figure 6A:
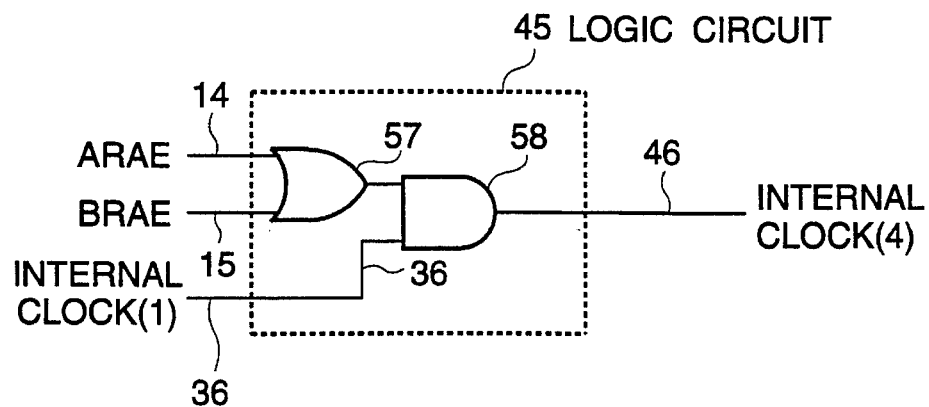
FIG. 6A is a logic circuit diagram showing a construction of the logic circuit included in the synchronized semiconductor memory device shown in FIG. 5.

As shown in FIG. 6A, the logic circuit 45 includes an OR circuit 57 receiving the "A bank" row address enable signal ARAE 14 and the "B bank" row address enable signal BRAE 15, and an AND circuit receiving an output of the OR circuit 58 and the internal clock signal (1) 38 and outputting an internal clock signal (4) 46.

Figure 6B:
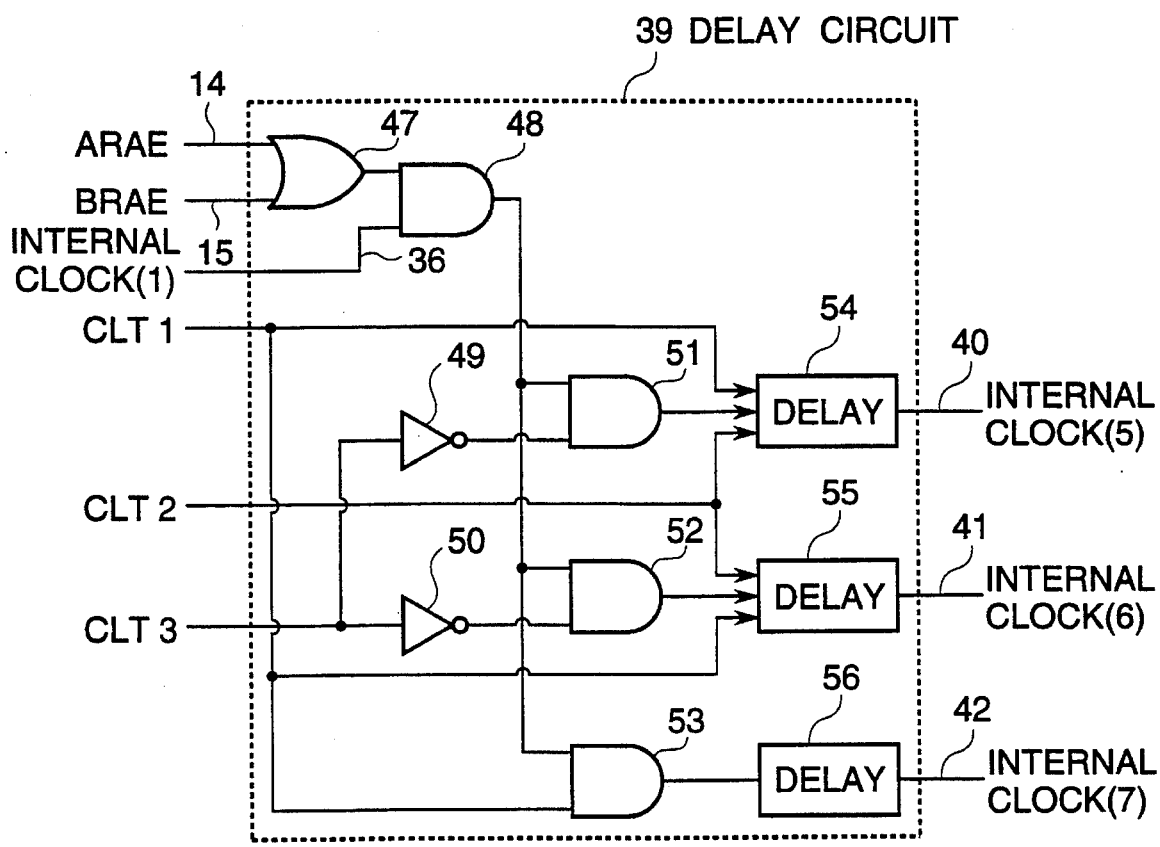
FIG. 6B is a logic circuit diagram showing a construction of the delay circuit included in the synchronized semiconductor memory device shown in FIG. 5.

As shown in FIG. 6B, the delay circuit 39 of this embodiment includes an OR circuit 47 receiving the "A bank" row address enable signal ARAE 14 and the "B bank" row address enable signal BRAE 15, an AND circuit 48 receiving an output of the OR circuit 47 and the internal clock signal (1) 36, two inverters 49 and 50 receiving the level signal CLT3 for the "CAS LATENCY 3", an AND circuit 51 receiving an output of the AND circuit 48 and an output of the inverter 49, an AND circuit 52 receiving the output of the AND circuit 48 and an output of the inverter 50, an AND circuit 53 receiving the output of the AND circuit 48 and the level signal CLT1 for the "CAS LATENCY 1", a delay circuit 54 receiving the level signal CLT1 for the "CAS LATENCY 1", an output of the AND circuit 51 and the level signal CLT2 for the "CAS LATENCY 2", for delaying the received (namely, timing-adjusted) signal so as to output the delayed received signal as an internal clock signal (5) 40, a delay circuit 55 receiving the level signal CLT2 for the "CAS LATENCY 2", an output of the AND circuit 52 and the level signal CLT1 for the "CAS LATENCY 1", for delaying the received (namely, timing-adjusted) signal so as to output the delayed received signal as an internal clock signal (6) 41, and a delay circuit 56 receiving an output of the AND circuit 53, for delaying the received signal so as to output the delayed (namely, timing-adjusted) received signal as an internal clock signal (7) 42.

With the above mentioned construction of the delay circuit 39, when the output of the AND circuit 48 is at the LOW level, all the AND circuits 51, 52 and 53 are blocked, and when the output of the AND circuit 51 is at the LOW level, the delay 54 is blocked from outputting any received signal, namely, the internal clock signal (5) 40. When the output of the AND circuit 52 is at the LOW level, the delay 55 is blocked from outputting any received signal, namely, the internal clock signal (6) 41, and when the output of the AND circuit 53 is at the LOW level, the delay 56 is blocked from outputting any received signal, namely, the internal clock signal (7) 42.

Figure 7:
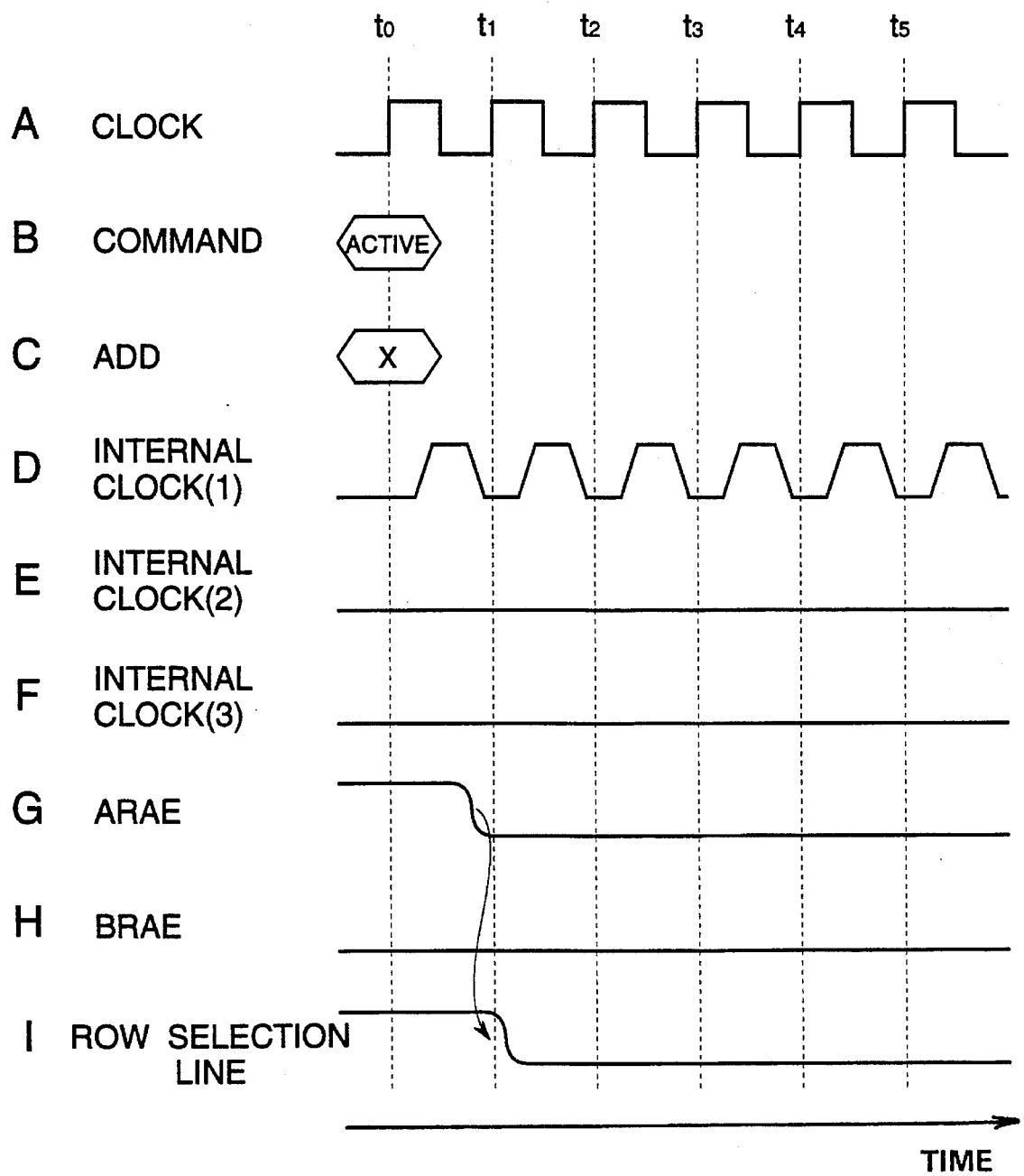
FIG. 7 is a timing chart illustrating an operation of the synchronized semiconductor memory device shown in FIG. 5.

Referring to "A" to "I" of FIG. 7, signal waveforms at various points at the time of applying a precharge command signal are illustrated.

In the embodiment shown in FIG. 5, an operation when an ACTIVE command (row address operation command: the signals CSB and RASB are at a LOW level and the signals CASB and WEB are at a HIGH level) is applied, a data reading operation when a READ command (reading operation command: the signals CSB and CASB are at a LOW level and the signals RASB and WEB are at a HIGH level) is applied and an address ADD(A1) is applied, and a data writing operation (writing operation command: the signals CSB, CASB and WEB are at a LOW level and the signal RASB is at a HIGH level) is applied, are fundamentally the same as those in the conventional example shown in FIGS. 1 to 4. Therefore, in order to avoid a double explanation in the following, an operation in connection with the delay circuit 39 and the logic circuit 45 on the shown embodiment will be described by paying attention to a feature of the shown embodiment differing from the prior art example.

The embodiment shown in FIG. 5 is a two-bank type synchronized semiconductor memory device, similarly to the prior art example explained hereinbefore. In the shown embodiment, the delay circuit 39 is supplied with the internal clock signal (1) 36 generated in the internal clock signal generating circuit 35, the level signals CLT1, CLT2 and CLT3 set by the mode setting circuit in accordance with a given mode register set cycle, and the "A bank" and "B bank" row address enable signals ARAE and BRAE generated by the row address control circuit 13. Similarly to the prior art example, when the active command for each bank is applied through the terminal 61, the row address enable signal ARAE or BRAE is brought to the HIGH level. In addition, when a precharge command (row address precharge command: the signals CSB, RASB and WEB are at a LOW level and the signal CASB is at a HIGH level), the row address enable signals ARAE are BRAE are returned to the LOW level.

Now, it is assumed that it is in a condition in which a certain row selection line in the A bank is selected. At a timing t0 in FIG. 7, a precharge command for the A bank is applied, the row address enable signal ARAE 14 outputted from the row address control signal is brought to the LOW level, so that a row selection line 9 corresponding to the memory cell array 10 is put in a non-selected condition by action of the row decoder 8. Accordingly, in the logic circuit 45 shown in FIG. 6A, both of the signals ARAE and BRAE are brought to the LOW level, and therefore, in the precharge condition, even if the internal clock signal (1) 36 is brought to the HIGH level, the internal clock signal (4) 46 acting a write data latching timing signal is blocked by the AND circuit 58, so that the data input function is stopped. However, in a condition in which a row address system for any one bank is operating, if the row address enable signal for the one bank is at the HIGH level, the internal clock signal (4) 46 is generated in response to the internal clock signal (1) 36.

In the delay circuit 39 shown in FIG. 6B, on the other hand, both of the row address enable signals ARAE and BRAE are at the LOW level in the precharge condition, so that even if the internal clock signal (1) 36 is brought to the HIGH level, the internal clock signals (5) 40, (6) 41 and (7) 42, which are outputted through the AND circuits 51, 52 and 53 and the delay circuits 54, 55 and 56, are blocked similarly to the internal clock signal (4) 46, since the internal clock signal (1) 36 is blocked by the AND circuit 48 whose output is brought to the LOW level. Accordingly, the write control circuit 26, the read control signal 27 and the data output function, which are triggered by these internal clock signals (5) 40, (6) 41 and (7) 42, respectively, are put in a function stop condition.

But, when an external active command signal is applied, the internal clock signal (4) 46 is normally generated from the logic circuit 45 so that the data input function operates properly, and the internal clock signals (5) 40, (6) 41 and (7) 42 are normally generated from the delay circuit 39 after these signals are timing-adjusted by the delays 54, 55 and 56, so that the write control circuit 26, the read control signal 27 and the data output function normally operate.

In the above mentioned embodiment, in the precharge condition in which no external active command is applied, the logic circuit 45 receiving the internal clock signal (1) 36 generating by the internal clock signal generating circuit 35 and the row address enable signals for the A bank and the B bank, generates no internal clock signals (4) 46, and therefore, stops the data write operation. On the other hand, the delay circuit 39 receiving the internal clock signal (1) 36, the row address enable signals for the A bank and the B bank, and the level signals CLT1, CLT2 and CLT3 set in accordance with a given mode register set cycle, generates no internal clock signal (5) 40, no internal clock signal (6) 41, or no internal clock signal (7) 42. In other words, the delay circuit 39 stops the operation of the write control circuit 26 and the read control circuit 27. Since the logic circuit 45 and the delay circuit 39 as mentioned above are provided in the internal clock timing control means, it is possible to reduce the standby current in the precharge condition. Namely, a wasteful current consumption can be greatly reduced.

The invention has thus been shown and described with reference to the specific embodiments. However, it should be noted that the present invention is in no way limited to the details of the illustrated structures but changes and modifications may be made within the scope of the appended claims.

I claim:

1. A synchronized semiconductor memory device comprising:

a memory cell array constituting a dynamic random access memory;

address input means for receiving an external address signal containing a row address/column address;

address set means for receiving an address information from the address input means and for generating and outputting a memory selecting signal to said memory cell array;

command input means for receiving an external command signal containing a row address selection control/reading control/writing control;

data reading/writing control means for receiving command information from the command input means, and for controlling a data read operation and a data writing operation to the memory cell array;

data output means controlled by the data reading/writing control means for outputting data read from the memory cell array;

data input means controlled by the data reading/writing control means for receiving data to be written into said memory cell array;

clock input means for receiving an external clock signal; and internal clock generation means for receiving clock information from the clock input means, and for generating a predetermined reference internal clock; and internal clock timing control means for receiving the predetermined reference internal clock, and for generating a plurality of internal clock signals having different timings wherein the improvement comprises:

first circuit means, provided in the internal clock timing control means, to receive the reference internal clock generated in the internal clock generation means, a plurality of level signals set in accordance with a given mode register set cycle, and a plurality of row address enable signals, and for generating at least one internal clock signal for timing-controlling the data reading/writing means; and second circuit means, provided in the internal clock timing control means, to receive the reference internal clock generated in the internal clock generation mans and the plurality of row address enable signals, and for generating another internal clock signal for timing-controlling the data input means.

2. A synchronized semiconductor memory device as claimed in claim 1 wherein the first circuit means includes an OR circuit receiving an "A bank" row address enable signal and a "B bank" row address enable signal, a first AND circuit receiving an output of the OR circuit and the reference internal clock, first and second inverters receiving a level signal for a "CAS LATENCY 3" mode, a second AND circuit receiving an output of the first AND circuit and an output of the first inverter, a third AND circuit receiving the output of the first AND circuit and an output of the second inverter, a fourth AND circuit receiving the output of the first AND circuit and a level signal for "CAS LATENCY 1" mode, a first delay circuit receiving the level signal for the "CAS LATENCY 1" mode, an output of the second AND circuit and a level signal for a "CAS LATENCY 2" mode, for delaying the received signal so as to output the delayed received signal as a first internal clock, a second delay circuit receiving the level signal for the "CAS LATENCY 2" mode, an output of the third AND circuit and the level signal for the "CAS LATENCY 1" mode, for delaying the received signal so as to output the delayed received signal as a second internal clock, and a third delay circuit receiving an output of the fourth AND circuit, for delaying the received signal so as to output the delayed received signal as a third internal clock, and wherein the second circuit means includes an OR circuit receiving the "A bank" row address enable signal and the "B bank" row address enable signal, and an AND circuit receiving an output of the OR circuit and the reference internal clock, for outputting a logical product signal as the above-mentioned another internal clock signal.

3. A synchronized semiconductor memory device as claimed in claim 1, in which the first circuit means comprises a combination of logical elements which are responsive to an "A bank" row address enable signal, to a "B bank" row address enable signal and to a reference internal clock to output a first internal clock, a second internal clock and a third internal clock, in which the combination of logic elements is effective to produce none of the first internal clock, the second internal clock and the third internal clock when the "A bank" and the "B bank" row address enable signals are in an inactive state.

\* \* \* \* \*